(12) United States Patent
Yang

(10) Patent No.: US 8,018,758 B2
(45) Date of Patent: Sep. 13, 2011

(54) GATE DRIVE VOLTAGE BOOST SCHEMES FOR MEMORY ARRAY

(75) Inventor: Hsu Kai Yang, Pleasanton, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 273 days.

(21) Appl. No.: 12/459,655

(22) Filed: Jul. 6, 2009

(65) Prior Publication Data

US 2011/0002162 A1    Jan. 6, 2011

(51) Int. Cl.
*G11C 11/00*    (2006.01)
(52) U.S. Cl. .................. 365/158; 365/171; 365/173
(58) Field of Classification Search .............. 365/158, 365/171, 173
See application file for complete search history.

(56) References Cited

U.S. PATENT DOCUMENTS

| 6,714,390 B2 | 3/2004 | Terada et al. |
| 6,754,055 B2 | 6/2004 | Ono et al. |
| 6,961,265 B2 | 11/2005 | Witcraft et al. |
| 6,985,382 B2 | 1/2006 | Fulkerson et al. |
| 7,046,547 B2 | 5/2006 | Witcraft et al. |
| 7,085,190 B2 * | 8/2006 | Worley et al. ............ 365/230.06 |

* cited by examiner

*Primary Examiner* — Son Dinh
*Assistant Examiner* — Nam Nguyen
(74) *Attorney, Agent, or Firm* — Saile Ackerman LLC; Stephen B. Ackerman; Larry J. Prescott

(57) ABSTRACT

This invention describes a circuit and method to limit the stress caused by gate voltages required to write a one or zero in magnetic memory elements using the Giant magneto-resistive effect, such as Phase Change RAM and Spin Moment Transfer MRAM, sometimes referred to as Spin Torque Transfer MRAM, which require high programming currents. The circuit and method selects one cell at a time for writing a one or a zero, different voltages to write a one or a zero, and a precharge circuit to limit the stress on non selected cells.

20 Claims, 3 Drawing Sheets

GATE DRIVE VOLTAGE BOOST SCHEMES FOR MEMORY ARRAY

BACKGROUND OF THE INVENTION

(1) Field of the Invention

This invention relates to gate drive voltage for magnetic memory technologies, such as Phase Change RAM and Spin Moment Transfer MRAM, sometimes referred to as Spin Torque Transfer MRAM, cells which require programming currents higher than the minimum cell transistor can provide without degrading the life of the cell transistor. More particularly the invention relates to circuits and methods for programming these cell transistors by applying high gate voltages only to those cell transistors into which a one or zero is being written.

(2) Description of Related Art

U.S. Pat. Nos. 7,046,547 B2 and 6,961,265 B2 to Witcraft et al. describe methods and apparatus that allow data to be stored in a magnetic memory cell, such as a giant magneto-resistance cell. The inventions describe advantageously winding a word line around a magnetic memory cell to increase the magnetic field induced by the word line.

U.S. Pat. No. 6,985,382 B2 to Fulkerson et al. describe a technique to read a stored state in a magneto-resistive random access memory device, MRAM, such as a giant magneto-resistance MRAM device or a tunneling magneto-resistance device, TMR. The technique uses a bit line that is segmented into a first portion and a second portion. An interface circuit compares the resistance of a first portion and a second portion of a first bit line to the resistance of a first portion and a second portion of a second bit line to determine the logical state of a cell in the first bit line.

U.S. Pat. No. 6,754,055 B2 to Ono et al. describes a giant magneto-resistive effect element which includes a laminated layer film having a ferromagnetic film, a non-magnetic film, and an anti-ferromagnetic film.

U.S. Pat. No. 6,714,390 B2 describes a giant magneto-resistive effect element capable of producing a high output and a high resistance and which can cope with a high recording density and a magneto-resistive effect type head, a thin film magnetic memory, and a thin film magnetic sensor each of which includes this giant magneto-resistive effect element.

SUMMARY OF THE INVENTION

Magnetic memory elements using the Giant magneto-resistive effect, such as Phase Change RAM and Spin Moment Transfer MRAM, sometimes referred to as Spin Torque Transfer MRAM, require high programming currents. Since these currents are controlled by a cell transistor, a field effect transistor, a high voltage between the source and/or drain is required to produce sufficient memory cell current to program the memory cells. This high gate to source/drain voltage and high memory cell current can significantly reduce the life of the cell transistor.

It is a principal objective of this invention to provide a circuit which can write information into individual memory cells, a one or a zero, while minimizing the gate voltage stress in the cell transistors of the memory cells in which no information is being written.

It is another principal objective of this invention to provide a method of writing information into individual memory cells, a one or a zero, while minimizing the gate voltage stress in the cell transistors of the memory cells in which no information is being written.

These objectives are achieved by only applying the high gate to drain voltage, or gate to source voltage to the cells in which a one or a zero is to be written so that only those cells which are to be written see the high gate voltage stress one at a time. The voltage stress is further reduced on the cells in which no information is to be written by the use of a precharge-discharge circuit.

Different voltage levels are required for read and write operations on the memory cells with the write operations requiring the highest currents. To reduce the stress on the cell transistors different gate voltages are applied for read and write operations with the write operation being the most severe.

In writing information into one of the memory cells only the voltage on the word line connected to gate of the cell transistor in that memory cell is raised, which also raises the gate voltage of all the cell transistors connected to that word line, that is all the cell transistors in that particular row. A double bit line circuit connects a BLC line and a BLT line across all of the memory cells in a particular column. At the same time the voltage of the word line connected to memory cell to be written is raised the voltage across the BLC and BLT lines for the column which contains the memory cell to be written is also raised which raises the voltage across all of the memory cells in the same column as the memory cell being written, however only the memory cell being written in that particular row of the memory array sees the increase in gate voltage. In addition bit line transistors and a precharge circuit are used to further limit the stress on the cell transistors for the cells which are not being written.

Writing a one in a memory cell requires greater cell current, and thus a greater gate voltage at the cell transistor, than writing a zero. Reading a memory requires the least cell current and thus the least gate voltage. Writing memory cells one cell at a time, using different gate voltages for writing a one and writing a zero, using a different gate voltage for reading a cell, and a precharge circuit are all used to limit the overall voltage stress on the cell transistors in the array.

DESCRIPTION OF THE PREFERRED EMBODIMENTS

Refer now to the Drawings for a description of the preferred embodiments of this invention. In these descriptions all transistors are field effect transistors and will be described herein simply as transistors.

Figure 1:
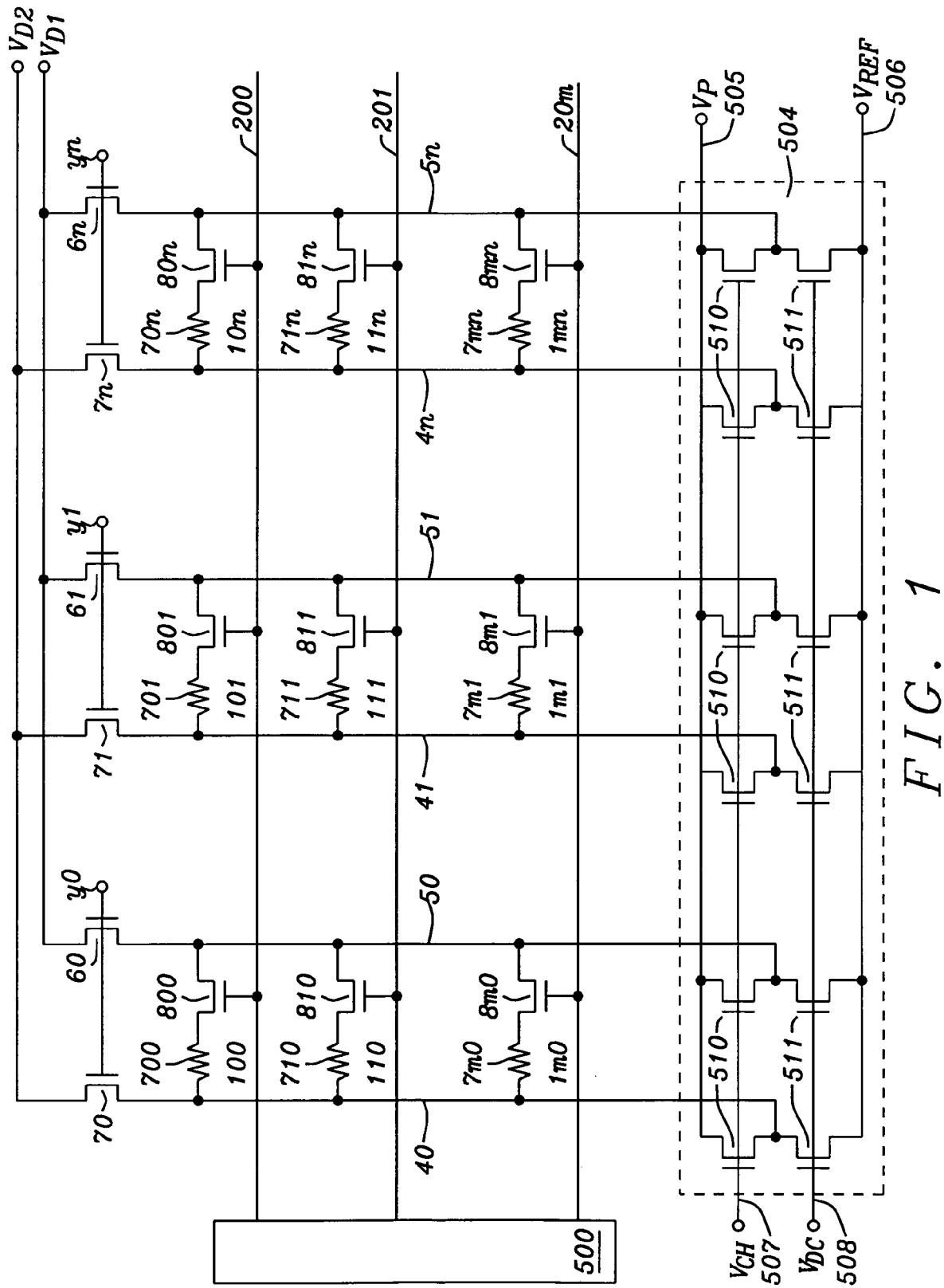
FIG. 1 shows a schematic diagram of the memory array circuit for the circuit and method of this invention.

FIG. 1 shows a schematic drawing of the memory cell array used in this invention. FIG. 1 shows an array of memory cells arranged in rows and columns 100, 101, . . . 10n; 110, 110, . . . , 11n; . . . ; 1m0, 1m1, . . . , 1mn. Each of the memory cells has a magnetic memory element 700, 701, . . . , 70n; 710, 711, . . . , 71n; 7m0, 7m1, . . . , 7mn in series with a cell transistor 800, 801, . . . , 80n; 810, 811, . . . , 81n; 8m0, 8m1, . . . , 8mn. These magnetic memory elements 700, 701, . . . , 70n; 710, 711, . . . , 71n; 7m0, 7m1, . . . , 7mn are two terminal devices and can be represented by a resistor, as shown in FIG. 1. Each column of the array has a BLC line 40, 41, . . . , 4n connected to one terminal of each magnetic memory element 7x0, 7x1, . . . , 7xm in that column (x takes on values from 0 to n) and a BLT line 50, 51, . . . , 5n connected to the drains of the cell transistors 8x 0, 8x1, . . . , 8xm in that column (x takes on values from 0 to n). The drains of the cell transistors in each cell are connected to the other terminal of the magnetic memory element in that cell, as shown in FIG. 1.

A first voltage source, VD1, is connected through a BLT transistor 60, 61, . . . , 6n to each BLT line 50, 51, . . . , 5n. A second voltage, VD2, is connected through a BLC transistor 70, 71, . . . , 7n to each BLC line 40, 41, . . . , 4n as shown in FIG. 1. The gates of the BLT and BLC transistors for each column are connected together and connected to a gate signal source. As shown in FIG. 1 the gates to transistors 60 and 70 are connected to gate signal $y_0$, the gates of transistors 61 and 71 are connected to gate signal $y_1$, . . . , and the gates of transistors 6n and 7n are connected to gate signal $y_n$ so that the first voltage source, $V_{D1}$, and the second voltage source, $V_{D2}$, can be applied to the BLT and BLC lines for each column of the array separately and individually. The gates of the cell transistors in each row of the array are connected to a word line 200, 201, . . . , 20m for that row of the array. As shown in FIG. 1 the word lines 200, 201, . . . , 20m are connected to row decoding circuitry 500.

In order to further reduce the stress on the cell transistors in the non selected cells a precharge circuit 504 is used. The precharge circuit 504 is also shown in FIG. 1. The precharge circuit has a first transistor 510 and a second transistor 511 for each BLT line and each BLC line. The sources of the first transistors 510 are connected to a precharge voltage supply, $V_P$, 505. The drains of the second transistors 511 are connected to a reference voltage supply, $V_{REF}$, 506. The drains of each first transistor 510 are connected to the source of one of the second transistors and to one of the BLT lines or one of the BLC lines. The gates of the first transistors 510 are connected together and to a charge gate signal, $V_{CH}$, 507. The gates of the second transistors 511 are connected together and to a discharge gate signal, $V_{DC}$, 508. For the example being considered for this example it is desired to keep the voltage between the source or drain and gate of the unselected cells at no more than 1.2 volts the voltage between the source or drain of the selected cells at no more than 1.8 volts.

Figure 2A:
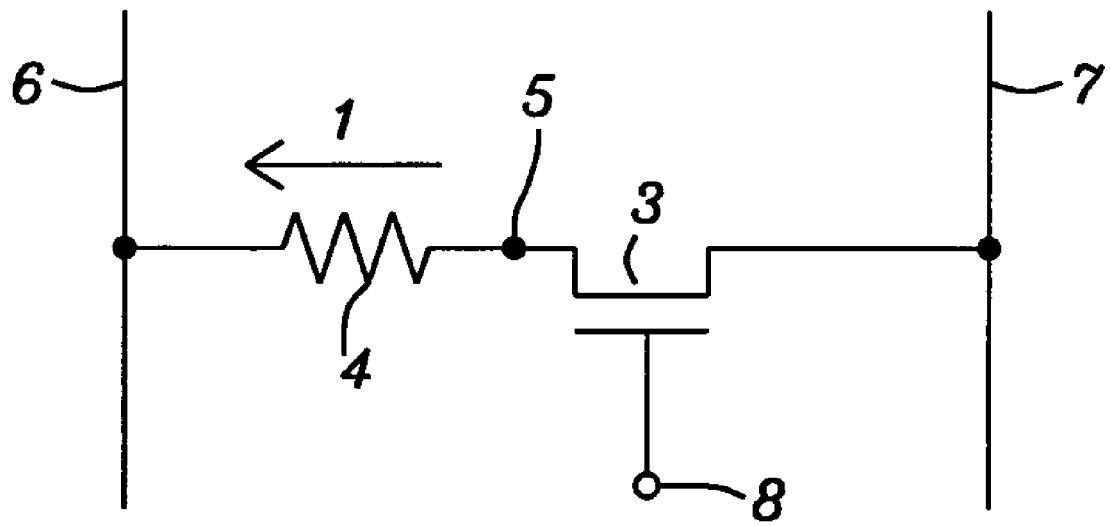
FIG. 2A shows a schematic representation of storing a 1 in the memory cell used in this invention.
Figure 2B:
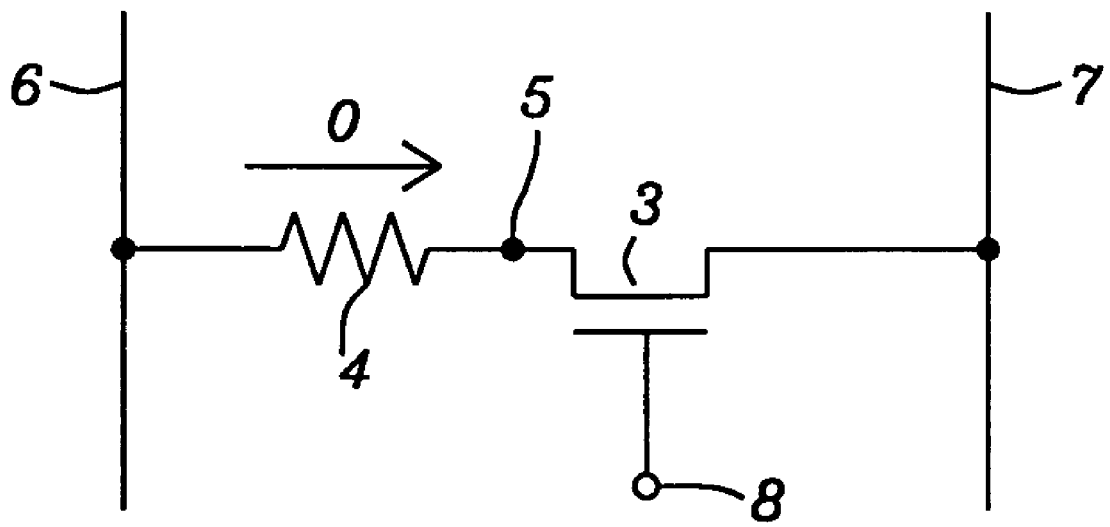
FIG. 2B shows a schematic representation of storing a 0 in the memory cell used in this invention.

Refer now to FIGS. 2A and 2B for a description of storing a 1 or a 0 in the memory cell. As shown in FIG. 2A a 1 is stored in the magnetic memory element 4 by causing a current to flow from the cell transistor 3 into the magnetic memory element 4. This current is caused to flow by applying voltages to the BLC line 6, the BLT line 7, and the gate 8 of the cell transistor 3. As shown in FIG. 2B a 0 is stored in the magnetic memory element 4 by causing a current to flow from the magnetic memory element 4 into the cell transistor 3. This current also is caused to flow by applying voltages to the BLC line 6, the BLT line 7, and the gate 8 of the cell transistor 3. The stress conditions on the cell transistor 3 are different when the magnetic memory element is being read or being written. Also, the stress conditions on the cell transistor when a 1 is written into the magnetic memory element are different from the stress conditions when a 0 is being written into the magnetic memory element. As can be seen from FIGS. 2A and 2B the voltage at the inter connecting point between the cell transistor 3 and the magnetic memory element 5 and the gate 8 of the cell transistor 3 will be higher when a 1 is being written into the magnetic memory element than when a 0 is being written into the magnetic memory element.

Figure 3:
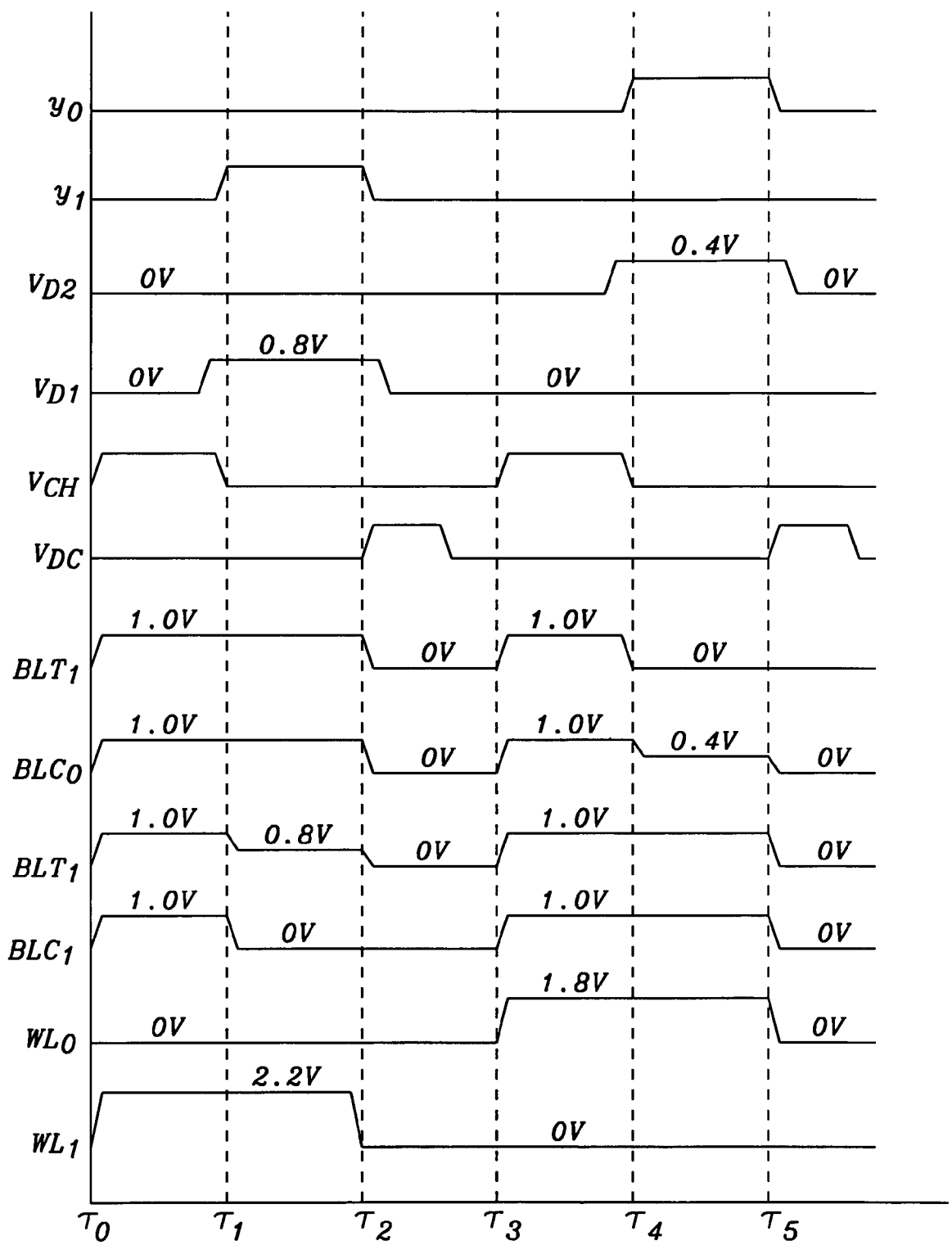
FIG. 3 shows a timing diagram for circuit and method of this invention.

Refer now to FIGS. 1 and 3. The circuit and methods of this invention provide means to limit the stress on the cell transistor to acceptable levels for reading the magnetic memory element or writing either a 1 or a 0 in the magnetic memory element. This is accomplished by writing either a 1 or a 0 into a single magnetic memory element at a time and by using a precharge circuit 540. Writing a 1 into cell 111 followed by writing a 0 into cell 100, see FIG. 1, will now be described with reference to the timing diagram shown in FIG. 3. Although not shown in FIG. 3, during the writing a 1 into cell 111 and a 0 into cell 100 the gate signals $y_2, y_3, \ldots, y_n$ to the BLT transistors 62, 63, . . . , 6n for the remaining BLT lines and to the BLC transistors 72, 73, . . . , 7n for the remaining BLC lines remain low so that the these transistors remain off and neither the first voltage source $V_{D1}$ nor the second voltage source $V_{D2}$ are connected to these BLT and BLC lines.

In this description of the operation of the memory the reference voltage or low voltage will be ground or zero volts. Those skilled in the art will recognize that it is the difference between the applied voltages and the reference voltage that is important and the reference voltage could be different that zero volts as long as the voltage differences remain the same. During the first time interval from $T_0$ to $T_1$ the gate signals $y_0$ and $y_1$ applied to the BLT and BLC transistors 60, 70, 61, and 71 remain low so that the BLT and BLC transistors 60, 70, 61, and 71 remain off. During this time interval the $V_{D2}$ voltage supply remains low, in this example zero volts, and the $V_{D1}$ voltage supply is raised from zero to about 0.8 volts, however the $V_{D1}$ and $V_{D2}$ voltage supplies are not connected to the BLC line 40 or the and BLT line 50 for the 100 memory cell nor to the BLC line 41 or the BLT line 51 for the 111 memory cell. During this time interval the charge gate signal, $V_{CH}$, 507 becomes high while the discharge gate signal remains low turning the first transistors 510 on and the second transistors 511 off so that the precharge voltage supply, $V_P$, 505 is connected to all of the BLT 50, 51, . . . , 5n and BLC lines 40, 41, . . . , 4n. In this example the precharge voltage supply, $V_P$, 505 is about 1.0 volts so that all of the BLT and BLC lines are precharged to 1.0 volts during this first time interval.

Also during this first time interval the signal applied to word line zero, $WL_0$, 200 remains at zero and the signal applied to word line 1, $WL_1$, 201 is increased to 2.2 volts. The signal applied to the remaining word lines 202, 203, . . . , 20m remains at zero throughout this example. These conditions place a maximum of 1.2 volts between the source or drain and the gate of the cell transistor 811 for cell 111 and a maximum of 1.0 volts between the gate and source or drain of the remaining cell transistors during this first time interval.

As shown in FIG. 3 during the second time interval, between $T_1$ and $T_2$, the gate signal $y_1$ for the BLC 41 and BLT 51 lines for the column containing memory cell 111 is raised from low to high while the gate charge signal, $V_{CH}$, is reduced to zero and the discharge gate signal, $V_{DC}$, remains at zero turning off the first transistors 510 and second transistors. The first voltage supply, $V_{D1}$, remains at 0.8 volts and the second voltage supply, $V_{D2}$, remains at zero volts during the second time interval. The voltage on the BLT line 51 for memory cell 111 is the same as the first voltage supply, $V_{D1}$, of 0.8 volts, the voltage on the BLC line 41 for memory cell 111 is the same as the second voltage supply of 0 volts. The voltage on the remaining BLT and BLC lines remain at 1.0 volts due to the capacitance of the lines. The voltage on the word line one, $WL_1$, 201 remains at 2.2 volts and the voltage on word line zero, $WL_0$, 200 remains at 0.0 volts. These conditions provide 0.8 volts between the BLT 51 and BLC 41 lines connected to memory cell 111 and 2.2 volts to the gate of the cell transistor for writing a 1 into memory cell 111. The voltage drop across the magnetic memory element 711 in memory cell 111 when a 1 is written in about 0.4 volts so that the maximum voltage seen from the gate to the drain of the cell transistor 811 is 1.8 volts and from the gate to the source of the cell transistor 811 is 1.4 volts. The maximum voltage seen between the gate and source or drain of the unselected cell transistors is 1.2 volts because of the remaining 1.0 volt precharge on the remaining BLT and BLC lines.

In the next time interval between $T_2$ and $T_3$ the gate signals to the BLT and BLC transistors are returned to zero, the voltage of the first voltage supply, $V_{D1}$, is returned to zero, the charge voltage signal, $V_{CH}$, remains at zero, the discharge voltage signal, $V_{DC}$, is raised so that the first transistors 510 are turned off and the second transistors 511 are turned on connecting all the BLT and BLC lines to the $V_{REF}$ voltage supply or ground. The writing a 1 in memory cell 111 is then completed.

The writing a 0 into memory cell 100 begins with the next time interval from $T_3$ to $T_4$ where the charge voltage signal, $V_{CH}$, 507 is raised while the discharge voltage signal, $V_{DC}$, 508 remains low turning on the first transistors 510, turning off the second transistors 511 and connecting all the BLT and BLC lines to the precharge voltage supply, $V_P$, of 1.0 volts. During this time interval the second voltage supply, $V_{D2}$, is raised to 0.4 volts and the first voltage supply, $V_{D1}$, remains at zero through the write a 0 in cell 100 operation. During the tine interval $T_3$ to $T_4$ the signal applied to word line zero, $WL_0$, is raised to 1.8 volts and the signal applied to word line one, $WL_1$, remains at 0.0 volts.

In the next time interval, $T_4$ to $T_5$, the gate signal $y_0$ for the BLC 40 and BLT 50 lines for the column containing memory cell 100 is raised from low to high while the gate charge signal, $V_{CH}$, is reduced to zero and the discharge gate signal, $V_{DC}$, remains at zero turning off the first transistors 510 and second transistors 511. The first voltage supply, $V_{D1}$, remains at 0.0 volts and the second voltage supply, $V_{D2}$, remains at 0.4 volts during this time interval. The voltage on the BLT line 50 for memory cell 100 is the same as the first voltage supply, $V_{D1}$, of 0.0 volts, the voltage on the BLC line 40 for memory cell 100 is the same as the second voltage supply of 0.4 volts. The voltage on the remaining BLT and BLC lines remain at 1.0 volts due to the capacitance of the lines. The voltage on the word line zero, $WL_0$, 200 remains at 1.8 volts and the voltage on word line one, $WL_1$, 201 remains at 0.0 volts. These conditions provide 0.4 volts between the BLC 40 and BLT 50 lines connected to memory cell 100 and 1.8 volts to the gate of the cell transistor for writing a 0 into memory cell 100. The maximum voltage seen from the gate to the drain or source of the cell transistor 800 is 1.8 volts. The maximum voltage seen between the gate and source or drain of the unselected cell transistors is 0.8 volts because of the remaining 1.0 volt precharge on the remaining BLT and BLC lines.

After $T_5$ the gate signals $y_0$ and $y_1$ are returned to zero, the gate discharge signal, $V_{DC}$, is raised turning on transistors 511 and the gate charge signal, $V_{CH}$, remains low keeping transistors 510 turned off so that all the BLC lines and BLT lines are returned to the potential of the reference voltage supply, $V_{REF}$, or ground potential. At this point another write operation or a read operation can begin. During a read operation smaller voltages between the gate and source or drain of the cell transistors are required, so that the maximum voltage between the gate and source or drain of the cell transistors is 1.8 volts for a selected cell and 1.2 volts for unselected cells for a write 1 operation and 1.8 volts for a selected cell and 0.8 volts for unselected cell for a write 0 operation.

While the invention has been particularly shown and described with reference to the preferred embodiments thereof, it will be understood by those skilled in the art that various changes in form and details may be made without departing from the spirit and scope of the invention.

What is claimed is:

1. A method of writing magnetic random access memory elements requiring high programming currents, comprising:
   providing a plurality of memory cells arranged in an array of m rows and n columns, wherein each memory cell has a magnetic memory element, each said magnetic memory element having a first terminal and a second terminal, and a cell transistor, each said cell transistor having a drain connected to said second terminal of said magnetic memory element, a gate, and a source, and wherein said memory cell stores a 1 by causing a first current to flow from said cell transistor into said magnetic memory element and stores a 0 by causing a second current to flow from said magnetic memory element into said cell transistor;
   providing a BLC line and a BLT line for each column of said array;
   providing a word line for each row of said array;
   connecting said first terminal of said magnetic memory elements in those said magnetic memory cells in each of said n columns to one of said BLC lines;
   connecting said source of each of said cell transistors in those said magnetic memory cells in each of said n columns to one of said BLT lines;
   connecting said gate of each of said cell transistors in those said magnetic memory cells in each of said m rows to one of said word lines;
   writing a 1 in one of said magnetic memory cells by applying a first voltage to the word line connected to that said magnetic memory cell, a second voltage to the BLC line connected to that said magnetic memory cell, a third voltage to the BLT line connected to that said magnetic memory cell, a fourth voltage to the remaining BLC and BLT lines, and a fifth voltage to the remaining word lines;
   writing a 1 in additional magnetic memory cells as desired, one cell at a time, using the above procedure;
   writing a 0 in one of said by applying a sixth voltage to the word line connected that said selected magnetic memory cell, a seventh voltage to the BLC line connected to that said selected magnetic memory cell, an eighth voltage to the BLT line connected to that said selected magnetic memory cell, said fourth voltage to the remaining BLC and BLT lines, and said fifth voltage to the remaining word lines; and
   writing a 0 in additional magnetic memory cells as desired, one cell at a time, using the above procedure.

2. The method of claim 1 wherein said writing a 1 in one of said magnetic memory cells in which a 1 is to be stored is accomplished by applying a first voltage to the word line connected to that said magnetic memory cell, a second voltage to the BLC line connected to that said magnetic memory cell, a third voltage to the BLT line connected to that said magnetic memory cell, a fourth voltage to the remaining BLC and BLT lines, and a fifth voltage to the remaining word lines, wherein all of said voltages are referenced to ground.

3. The method of claim 1 wherein said writing a 0 in one of said magnetic memory cells in which a 0 is to be stored is accomplished by applying a sixth voltage to the word line connected that said selected magnetic memory cell, a seventh voltage to the BLC line connected to that said selected magnetic memory cell, an eighth voltage to the BLT line connected to that said selected magnetic memory cell, said fourth voltage to the remaining BLC and BLT lines, and said fifth voltage to the remaining word lines, wherein all of said voltages are referenced to ground.

4. The method of claim 1 wherein said first voltage is about 2.2 volts, said second voltage is about 0.4 volts, said third voltage is about 0.8 volts, said fourth voltage is about 1.0 volts, said fifth voltage is about 0 volts, said sixth voltage is about 1.8 volts, said seventh voltage is about 0.4 volts, and said eighth voltage is about 0 volts.

5. The method of claim 1 wherein said cell transistors are field effect transistors.

6. The method of claim 1 wherein said fourth voltage is supplied using a precharge circuit.

7. The method of claim 6 wherein said precharge circuit comprises means to connect selected said BLT lines and BLC lines to a source of said fourth voltage, to ground, or to an open circuit.

8. The method of claim 6 wherein said precharge circuit comprises a precharge transistor and a discharge transistor for each BLT line and each BLC line, wherein said precharge transistors and each said discharge transistors are field effect transistors having a source, a drain, and a gate, and wherein the drain of each said precharge transistor is connected to the source of one of said discharge transistors and to one of said BLT or BLC lines, the drains of said discharge transistors are connected to ground, the sources of said precharge transistors are connected to said fourth voltage source, the gates of said precharge transistors are connected to a precharge signal source, and the gates of said discharge transistors are connected to a discharge signal source.

9. The method of claim 1 further comprising a first column select transistor and a second column select transistor for each column of said array, wherein said first and second column select transistors are field effect transistors and wherein each said first column select transistor has a drain connected to one of said BLC lines, a source connected to said a second voltage source, and a gate and each said second column select transistor has a drain connected to one of said BLT lines, a source connected to a third voltage source, and a gate connected to that said gate of said first column select transistor in the same column of said array and to a column select signal source.

10. The method of claim 4 wherein writing a 1 in one of said magnetic memory cells causes a maximum voltage between the gate and source or drain of the cell transistor of the selected magnetic memory cell of 1.8 volts and 1.2 volts for the non selected magnetic memory cells and writing a 0 in one of said magnetic memory cells causes a maximum voltage between the gate and source or drain of the cell transistor of the selected magnetic memory cell of 1.8 volts and 0.8 volts for the non selected magnetic memory cells.

11. A circuit for writing magnetic random access memory elements requiring high programming currents, comprising:
a plurality of memory cells arranged in an array of m rows and n columns, wherein each memory cell has a magnetic memory element, each said magnetic memory element having a first terminal and a second terminal, and a cell transistor, each said cell transistor having a drain connected to said second terminal of said magnetic memory element, a gate, and a source, and wherein said memory cell stores a one by causing a first current to flow from said cell transistor into said magnetic memory element and stores a zero by causing a second current to flow from said magnetic memory element into said cell transistor;
a BLC line for each column of said array wherein each BLC line is connected to said first terminal of said magnetic memory elements in those said magnetic memory cells in each of said n columns of said array;
a BLT line for each column of said array wherein each said BLT line is connected to said source of each of said cell transistors in those said magnetic memory cells in each of said n columns of said array; and
a word line for each said row of said array wherein each said word line is connected to said gate of each of said cell transistors in those said magnetic memory cells in each of said m rows of said array.

12. The circuit of claim 11 further comprising a precharge circuit wherein said precharge circuit comprises a precharge transistor and a discharge transistor for each BLT line and each BLC line, wherein each of said precharge transistors and each of said discharge transistors are field effect transistors having a source, a drain, and a gate, and wherein the drain of each said precharge transistor is connected to the source of one of said discharge transistors and to one of said BLT or BLC lines, the drains of said discharge transistors are connected to ground, the sources of said precharge transistors are connected to a fourth voltage source, the gates of said precharge transistors are connected to a precharge signal source, and the gates of said discharge transistors are connected to a discharge signal source.

13. The circuit of claim 12 wherein writing a 1 in one of said magnetic memory cells in which a one is to be stored is accomplished by applying a first voltage to the word line connected to that said magnetic memory cell, a second voltage to the BLC line connected to that said magnetic memory cell, a third voltage to the BLT line connected to that said magnetic memory cell, said fourth voltage to the remaining BLC and BLT lines, and a fifth voltage to the remaining word lines, wherein all of said voltages are referenced to ground.

14. The circuit of claim 12 wherein writing a 0 in one of said magnetic memory cells in which a zero is to be stored is accomplished by applying a sixth voltage to the word line connected that said selected magnetic memory cell, a seventh voltage to the BLC line connected to that said selected magnetic memory cell, an eighth voltage to the BLT line connected to that said selected magnetic memory cell, said fourth voltage to the remaining BLC and BLT lines, and a fifth voltage to the remaining word lines, wherein all of said voltages are referenced to ground.

15. The circuit of claim 11 wherein said cell transistors are field effect transistors.

16. The circuit of claim 13 wherein said first voltage is about 2.2 volts, said second voltage is about 0.4 volts, said third voltage is about 0.8 volts, said fourth voltage is about 1.0 volts, and said fifth voltage is about 0 volts.

17. The circuit of claim 14 wherein said fourth voltage is about 1.0 volts, said fifth voltage is about 0 volts, said sixth voltage is about 1.8 volts, said seventh voltage is about 0.4 volts, and said eighth voltage is about 0 volts.

18. The circuit of claim 11 further comprising a first column select transistor and a second column select transistor for each column of said array, wherein said first and second column select transistors are field effect transistors and wherein each said first column select transistor has a drain connected to one of said BLC lines, a source connected to said a second voltage source, and a gate and each said second column select transistor has a drain connected to one of said BLT lines, a source connected to a third voltage source, and a gate connected to that said gate of said first column select transistor in the same column of said array and to a column select signal source.

19. The circuit of claim 13 wherein writing a 1 in one of said magnetic memory cells causes a maximum voltage between the gate and source or drain of the cell transistor of the selected magnetic memory cell of 1.8 volts and 1.2 volts for the non selected magnetic memory cells.

20. The circuit of claim 14 wherein writing a 0 in one of said magnetic memory cells causes a maximum voltage between the gate and source or drain of the cell transistor of the selected magnetic memory cell of 1.8 volts and 0.8 volts for the non selected magnetic memory cells.

* * * * *